United States Patent [19]
Igarashi et al.

[11] Patent Number: 5,846,855
[45] Date of Patent: Dec. 8, 1998

[54] THIN-FILM TRANSISTOR AND METHOD FOR FABRICATING SAME AND LIQUID CRYSTAL DISPLAY DEVICE

[75] Inventors: Makoto Igarashi; Takuya Watanabe, both of Kawasaki, Japan

[73] Assignee: Fujitsu Limited, Kawasaki, Japan

[21] Appl. No.: 749,675

[22] Filed: Nov. 15, 1996

[30] Foreign Application Priority Data

May 17, 1996 [JP] Japan .................................. 8-123382

[51] Int. Cl.[6] .................................................. H01L 21/00
[52] U.S. Cl. ............................................ 438/158; 438/159
[58] Field of Search .................................... 438/158, 159, 438/160, 200

[56] References Cited

U.S. PATENT DOCUMENTS 5,637,519   6/1997   Tsai ........................................ 438/160

FOREIGN PATENT DOCUMENTS 4-307941   10/1992   Japan .
A-6-204247   7/1994   Japan .
A-7-106585   4/1995   Japan .

*Primary Examiner*—John F. Niebling
*Assistant Examiner*—Michael S. Lebentritt
*Attorney, Agent, or Firm*—Armstrong, Westerman, Hattori, McLeland, & Naughton

[57] ABSTRACT

A thin-film transistor including a gate electrode provided on a substrate, a gate insulation film provided on the gate electrode, an operative semiconductor film provided on the gate insulation film, and a channel protection film provided on the operative semiconductor film. Semiconductor contact portions are disposed so that they are covered by the channel protection film on either side of the operative semiconductor film. A source electrode and a drain electrode are connected to the semiconductor contact portions on either side of the channel protection film. The thin-film transistor can minimize the stray capacitance due to the overlapping of the source and drain electrodes with the gate electrode and is excellent in the contact characteristic. Also, a method for fabricating a thin-film transistor is disclosed.

7 Claims, 12 Drawing Sheets

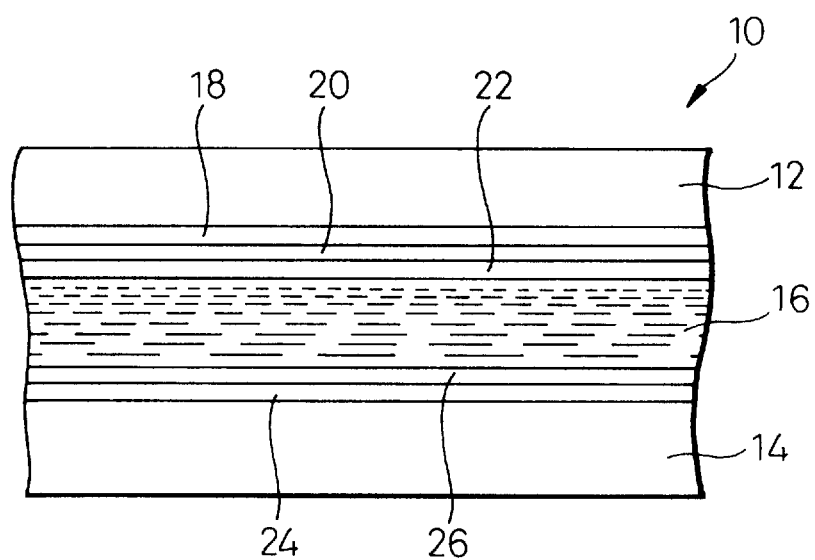

THIN-FILM TRANSISTOR AND METHOD FOR FABRICATING SAME AND LIQUID CRYSTAL DISPLAY DEVICE

BACKGROUND OF THE INVENTION

1. Field of the Invention

The present invention relates to a thin-film transistor and a method for producing the same and a liquid crystal display device.

2. Description of the Related Art

Recently, a liquid crystal display device having an active matrix drive including thin-film transistors (TFT) has been remarkably developed. The active matrix includes TFTs and picture electrodes arranged in regions defined by intersecting gate bus lines and drain bus lines.

The TFT includes a gate electrode, a gate insulation film, an operative semiconductor film, a channel protection film, a source electrode and a drain electrode. An ohmic contact layer is formed on the operative semiconductor film, through which the source electrode and the drain electrode are connected to the operative semiconductor film. When the TFT is produced, the gate electrodes and the gate bus lines are integrally formed with each other on the surface of the substrate and then above components are layered thereon. The drain electrodes are formed together with the drain bus lines, and the source electrodes are connected to the picture electrodes. The source electrode and the drain electrode may be reversed to each other.

The source electrode and the drain electrode are disposed above the gate electrode via an insulation film and the operative semiconductor film, and, if the source electrode and the drain electrode are overlapped with the gate electrode as seen from above, a stray capacitance is created. Since the stray capacitance interferes with the image formation, it is preferable that the source electrode and the drain electrode are not overlapped with the gate electrode.

Japanese Unexamined Patent Publication (Kokai) No. 7-106585, for example, discloses an arrangement in that the source electrode and the drain electrode are not overlapped with the gate electrode so that the stray capacitance created therebetween is minimized. According to this Patent Publication, a channel protection film is formed in self-alignment with the gate electrode so that the source electrode and the drain electrode can be selectively formed while using this channel protection film.

Japanese Unexamined Patent Publication (Kokai) No. 6-204247 also discloses an arrangement in that, by the self-alignment and the selective film formation, the overlap of the source electrode and the drain electrode with the gate electrode can be eliminated to minimize the stray capacity created therebetween. Further in this Patent Publication, a second semiconductor film is formed on the operative semiconductor film, outside the channel protection film and the source electrode and the drain electrode are provided on the second semiconductor film by the selective film formation.

In the arrangement described in said Japanese Kokai 6-204247, the second semiconductor film operates as an ohmic contact to further enhance the electric connection between the operative semiconductor film and the source and drain electrodes. There is a problem, however, when the source and drain electrodes are formed on the second semiconductor film by a thermal CVD method or the like, in that the second semiconductor film tends to be eroded to deteriorate the contact characteristic. While it is possible to provide the ohmic contact by doping the outer portion of the operative semiconductor film with an impurity, there is another problem in such a case in that the doped portion of the semiconductor film is eroded when the source and drain electrodes are formed by the thermal CVD method.

SUMMARY OF THE INVENTION

An object of the present invention is to provide a thin-film transistor, a method for fabricating the same and a liquid crystal display device, in which a stray capacitance due to the overlapping of source and drain electrodes with a gate electrode can be minimized and excellent contact characteristics is realized.

The above object is achievable by a thin-film transistor according to the present invention comprising a substrate, a gate electrode provided on the substrate, a gate insulation film provided on the gate electrode, an operative semiconductor film provided on the gate insulation film, a channel protection film provided on the operative semiconductor film semiconductor contact portions covered by the channel protection film on either side of the operative semiconductor film, and a source electrode and a drain electrode connected to the semiconductor contact portion on either side of the channel protection film.

Such a thin-film transistor can be produced by a method comprising the steps of: forming a gate electrode on a substrate, forming a gate insulation film on the gate electrodes, forming a layer on the gate insulation film for constituting an operative semiconductor film, forming an insulation film having a first predetermined pattern on the film to be the operative semiconductor film, doping the film to be the operative semiconductor film with impurity, while using the first patterned insulation film as a mask, to form the operative semiconductor film which is covered by the first pattern and is not doped with impurity and a semiconductor film which is not covered by the first pattern but doped with impurity, removing the first patterned insulation film, forming another insulation film for defining semiconductor contact portions, having a predetermined second pattern larger than the first patterned insulation film to be capable of covering the operative semiconductor film and at least part of the doped semiconductor film, and forming a source electrode and a drain electrode connected to the semiconductor contact portions.

A liquid crystal display device according to the present invention comprises thin-film transistors thus formed, gate bus lines connected to the gate electrodes, drain bus lines connected to the drain electrodes, and picture electrodes connected to the source electrodes.

In the above arrangement, since the overlapping of the gate electrode with the source or drain electrode is small, the stray capacitance created therebetween can be minimized. Also, the semiconductor contact portions covered by the channel protection film are provided on either side of the operative semiconductor film. The semiconductor contact portions located beneath the channel protection film are not eroded when the source electrode and the drain electrode are formed later, whereby the contact of the source electrode and the drain electrode with the operative semiconductor film are facilitated.

The thin-film transistor according to the present invention is effective for reducing an optical leakage current.

That is, the optical leakage current is generated in an adjoining area between a-Si (operative semiconductor layer) and n+a-Si (contact layer). In the conventional structure wherein a-Si (operative semiconductor layer) is flatly layered onto n+a-Si (contact layer) (in parallel to the substrate surface and the panel surface), the adjoining area becomes larger and cannot be sufficiently sealed from light, resulting in the large optical leakage current. On the contrary, according to the inventive thin-film transistor, since the adjoining area between a-Si (operative semiconductor layer) and n+a-Si (contact layer) is on the side surface of the layer (which is vertical to the substrate surface and the panel surface) and small (i.e., not unnecessarily large). Further, the adjoining area is located inner than the respective end of the gate electrode and thus can be sealed enough from the light. Thereby the inventive thin-film transistor is capable of reducing the optical leakage current.

BRIEF DESCRIPTION OF THE DRAWINGS

The present invention will be described in more detail with reference to the preferred embodiments illustrated in the attached drawings wherein:

FIG. 3 is a diagrammatic cross-sectional view of the liquid crystal display device according to the embodiment of the present invention;

DETAILED DESCRIPTION OF THE INVENTION

Figure 1:
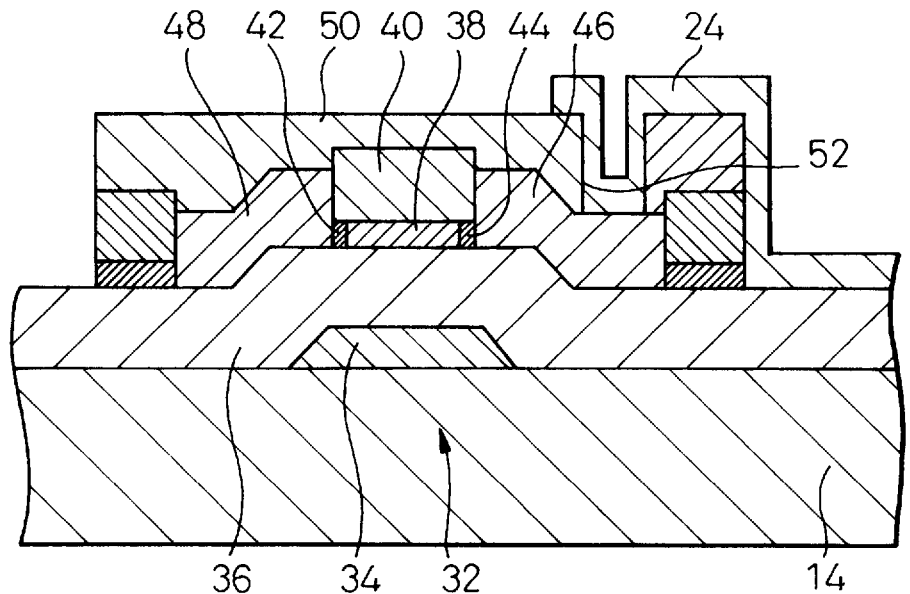
FIG. 1 is a side sectional view of the thin-film transistor and picture electrode according to the embodiment of the present invention.

FIG. 3 shows a liquid crystal display device 10 according to the embodiment of the present invention. The liquid crystal display device 10 includes a pair of substrates 12 and 14 and a liquid crystal 16 sealed between the substrates. One substrate 12 is provided with a color filter 18, a common electrode 20 and an orientation film 22. The other substrate 14 is provided with picture electrodes 24 and an orientation film 26. Polarizers (not shown) may be provided on the outer sides of these substrates.

Figure 2:
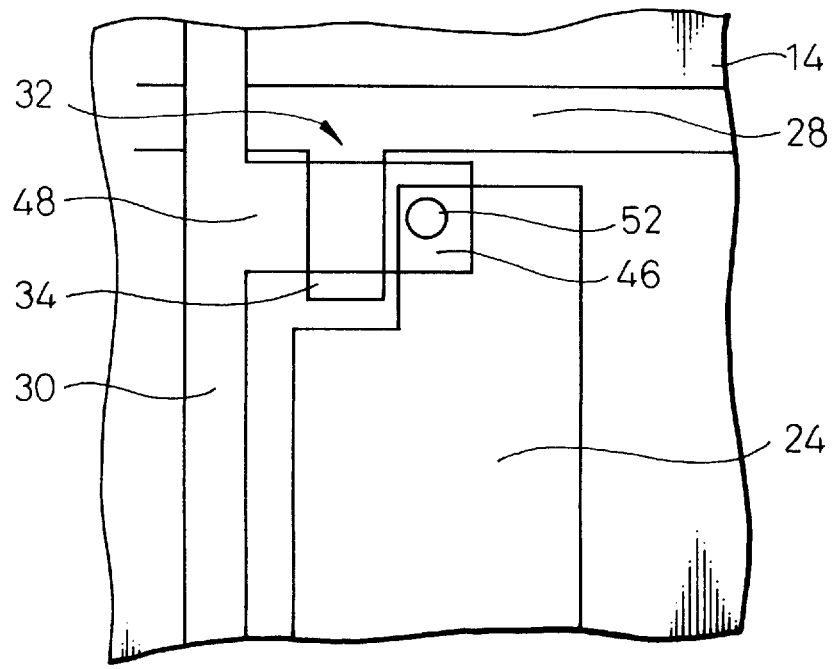
FIG. 2 is a diagrammatic plan view of the thin-film transistor and the pixel electrode shown in FIG. 1.
Figure 13:
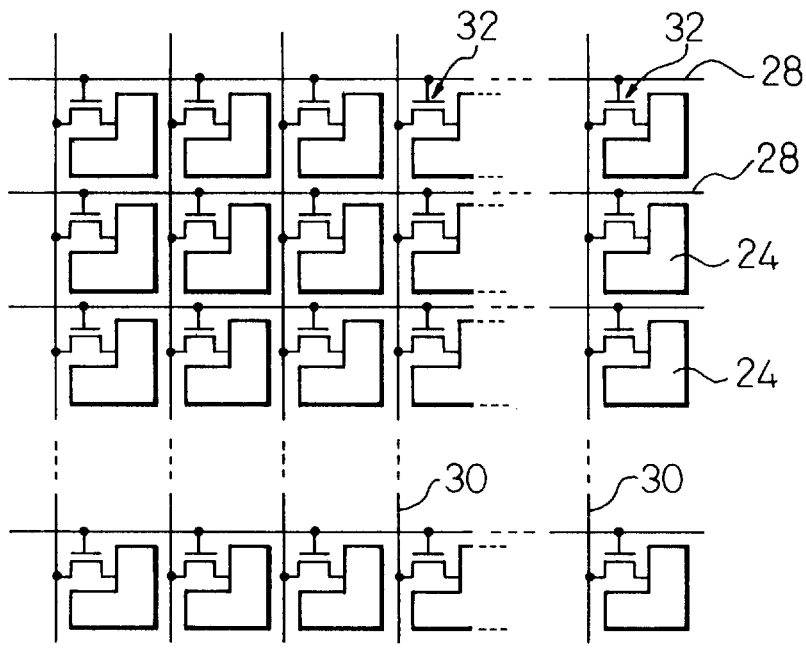
FIG. 13 shows an active matrix of the liquid crystal display device.

FIGS. 1, 2, and 13 illustrate the substrate 14 of the liquid crystal display device 10 having the picture electrodes 24. The substrate 14 has an active matrix together with the picture electrodes 24. The active matrix includes gate bus lines 28 and drain bus lines 30 extending across with each other to define a plurality of regions, within which thin-film transistors (TFT) 32 and the picture electrodes 24 are provided.

Each of TFT 32 comprises a gate electrode 34 provided on the substrate 14, a gate insulation film 36 provided on the gate electrode 34, an operative semiconductor film 38 provided on the gate insulation film 36, a channel protection film 40 provided on the operative semiconductor film 38, semiconductor contact portions 42, 44 covered by the channel protection film 40 on either side of the operative semiconductor film 38, and a source electrode 46 and a drain electrode 48 connected to the semiconductor contact portion 42 or 44 on the either side of the channel protection film 40.

The gate electrode 34 is integrally formed with the gate bus line 28, and thus electrically connected thereto. The drain electrodes 48 is integrally formed with the drain bus lines 30, and thus electrically connected thereto. A protection film 50 covers the gate bus line 28, the drain bus line 30 and TFT 32, and the picture electrodes 24 is connected to the source electrodes 46 via a hole 52 in the protection film 50. The source electrode 46 and the drain electrode 48 may be reversed to each other, and in such a case, the drain bus line 30 may be referred to as a source bus line.

The operative semiconductor film 38 comprises an a-Si film, and the semiconductor contact portion 42 or 44 functioning as an ohmic contact comprises an n+a-Si film prepared by a high concentration ion-doping to the a-Si film. The source electrode 46 and the drain electrode 48 are formed of a metallic film of tungsten (W) or others.

The source electrode 46 and the drain electrode 48 abut to the side walls of the channel protection film 40 but are not overlapped with the channel protection film 40. Since the gate electrode 34 is provided generally in alignment with the channel protection film 40, the overlapping of the gate electrode 34 with the source electrode and the drain electrode 48 is small whereby the stray capacitance created therebetween becomes very small. The semiconductor contact portions 42, 44 are offset inward from the inside of the channel protection film 40 and covered by the channel protection film 40 together with the operative semiconductor film 38. Accordingly, the semiconductor contact portions 42, 44 are assuredly located beneath the channel protection film 40 to facilitate the electric contact of the source electrode 46 and the drain electrode 48 to the operative semiconductor film 38.

An offset amount of the semiconductor contact portion 42 or 44 covered by the channel protection film 40 measured from the end thereof is controlled by a side etching for forming a first patterned insulation film 54 described later. Preferably, the offset amount is 2 μm or less.

FIGS. 4 to 12 illustrate a method for fabricating the thin-film transistor (TFT), according to one aspect of the present invention.

Figure 4A:
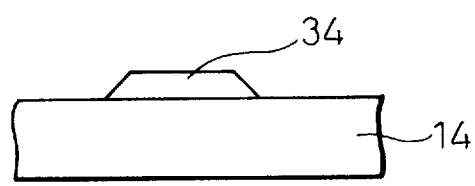
FIGS. 4A and 4B are cross-sectional and plan views illustrating the first step of a method for fabricating the thin-film transistor according to the first example.
Figure 4B:
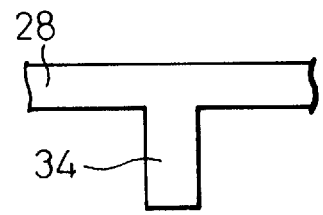

In FIGS. 4A and 4B, the gate electrode 34 is provided on the substrate 14. The gate bus line 28 is integrally formed with the gate electrode 34. For example, a chromium (Cr) film of 1500 Å in thickness is formed on a transparent glass substrate 14 by a sputtering method, and after coating the chromium film while using a resist, the resist is exposed while using a mask having a predetermined pattern. Then an unnecessary area of the chromium film is removed by a wet etching to result in the gate bus line 28 and the gate electrode 34, as shown in FIG. 4B. The resist is peeled off thereafter. These steps are referred to as a first photolithographic process.

Figure 5:
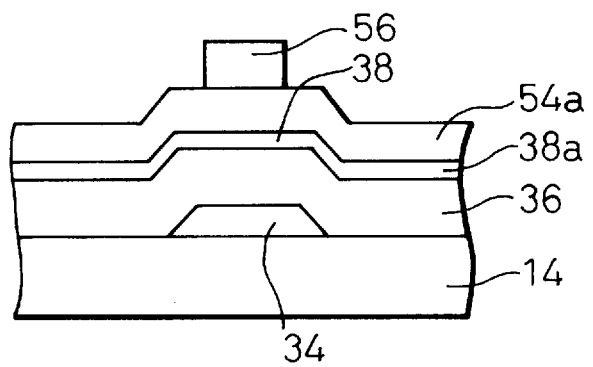
FIG. 5 is a cross-sectional view illustrating the next step of FIGS. 4A and 4B.

In FIG. 5, a silicon nitride (SiN) layer of 4000 Å, an amorphous silicon (a-Si) layer of 1000 Å and a SiN layer of 1000 Å are sequentially formed by a plasma CVD method to provide the gate insulation film 36 on the gate electrode 34, a layer 38a for constituting the operative semiconductor film 38 on the gate insulation film 36, and a layer 54a on the layer 38a for constituting an insulation film 54 having a first pattern.

Figure 6A:
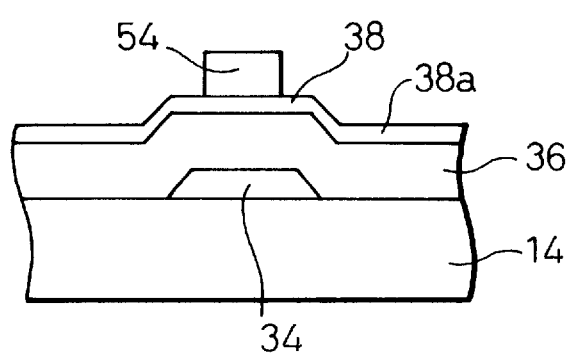
FIGS. 6A and 6B are cross-sectional and plan views illustrating the next step of FIG. 5.
Figure 6B:
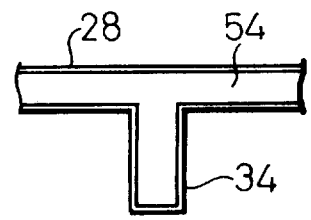

FIGS. 5, 6A and 6B illustrate the steps for forming the insulation film 54 having the first pattern from the layer 54a. As shown in FIG. 5, a resist 56 is applied onto the layer 54a to have a predetermined pattern thereon. That is, after applying the resist in a form of solution on the layer 54a, the resist is subjected to a self-alignment exposure from the back side of the substrate 14 while using the gate bus line 28 and the gate electrode 34 as a mask.

Then, the layer 54a is etched by a mixture solution of hydrofluoric acid and ammonium fluoride while using the resist 56 as a mask to result in the first patterned insulation film 54. Thereafter, a width of the insulation film 54 having the first pattern is made thinner by 1 μm than that of the resist 56 by a side etching. Accordingly, an amount of the offset of the semiconductor contact portion 42 or 44 measured from the end of the channel protection film 40 is controlled as described before, after which the resist 56 is peeled off. Thus, the insulation film 54 can be formed in the same pattern as the gate bus line 28 and the gate electrode 34. These steps are referred to as a second photolithographic process.

Figure 7A:
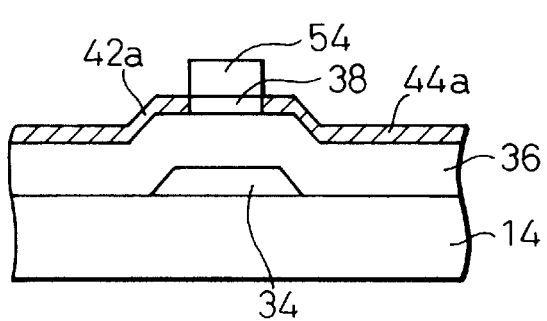
FIGS. 7A and 7B are cross-sectional and plan views illustrating the next step of FIGS. 6A and 6B.
Figure 7B:
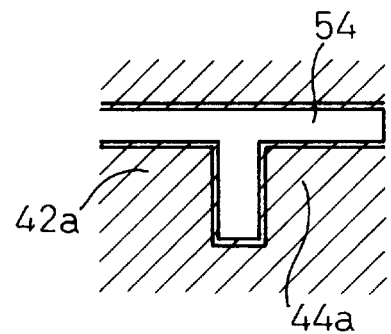

Next, as shown in FIGS. 7A and 7B, the layer 38a for constituting the operative semiconductor film 38 is doped with impurity while using the insulation film 54 having the first pattern as a mask (for example, P of 5e15ions/cm$^2$ is injected into the a-Si film). Then, a portion of the layer 38a beneath the insulation film 54 becomes the operative semiconductor film 38, while another portion of the layer 38a outside the insulation film 54 becomes a semiconductor film 42a or 44a doped with impurity.

Figure 8:
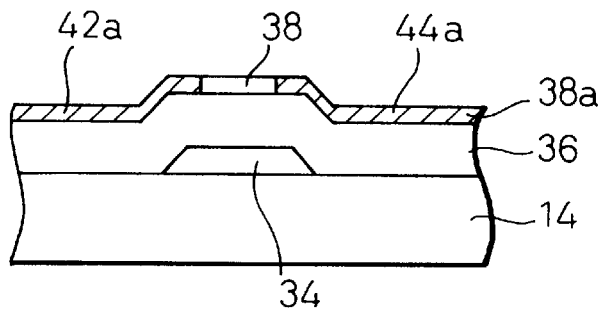
FIG. 8 is a cross-sectional view illustrating the next step of FIGS. 7A and 7B.

Thereafter, as shown in FIG. 8, the insulation film 54 having the first pattern is removed by the etching.

Figure 9A:
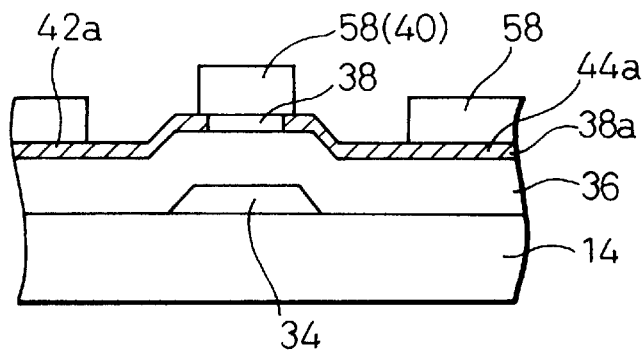
FIGS. 9A and 9B are cross-sectional and plan views illustrating the next step of FIG. 8.
Figure 9B:
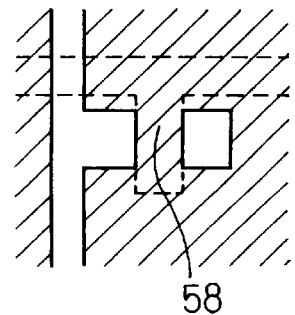

Then, as shown in FIGS. 9A and 9B, an insulation film 58 having a second pattern is formed on the layer 38a to become the operative semiconductor film 38.

That is, the insulation film 58 is prepared by forming a SiN layer of 3000 Å in thickness by a plasma CVD method, on which an image-reversal resist is coated, exposed and etched, whereby openings corresponding to the drain bus line 30, the drain electrode 48 and the source electrode 46 are formed. That is, the image-reversal resist is coated on the SiN layer and exposed from the front side of the substrate 14, while using a mask having patterns corresponding to the drain bus line 30 and the drain electrode 48/source electrode 46, and then subjected to the reversal exposure from the back side of the substrate 14, whereby portions of the resist corresponding to the drain bus line 30, the drain electrode 48 and the source electrode 46 are removed. These steps are referred to as a third photolithographic process. The etching of the insulation film 58 is carried out by RIE using $SF_6$ and $O_2$, after which the resist is peeled off.

In the area of TFT 32, the insulation film 58 having the second pattern becomes the channel protection 40 covering the operative semiconductor film 38. The insulation film 58 having the second pattern is larger than the insulation film 54 having the first pattern, and the channel protection film 40 covers the operative semiconductor film 38 and at least part of the doped semiconductor films 42a, 44a.

Figure 10:
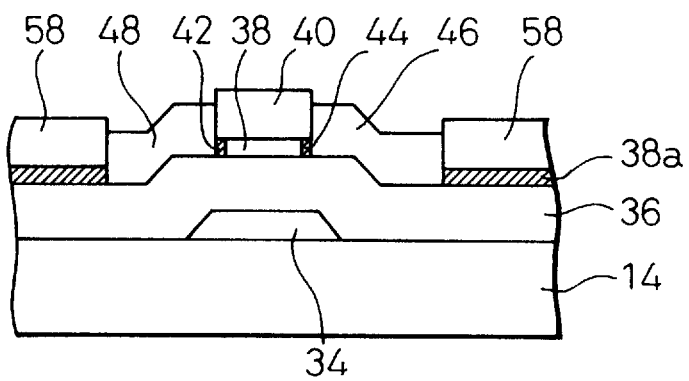
FIG. 10 is a cross-sectional view illustrating the next step of FIGS. 9A and 9B.

Then, as shown in FIG. 10, a tungsten (W) layer of 2500 Å in thickness is formed by a thermal CVD method to prepare the source electrode 46 and the drain electrode 48. The tungsten layer is formed by introducing the condition wherein $WF_6$, $SiH_4$ and $H_2$ gases at 30, 18 and 400 sccm, respectively, under a pressure of 20 mTorr and a substrate temperature of 250° C. Prior to this film forming step, a natural oxidation film on the n+a-Si film is removed by a plasma cleaning using $NF_3/H_2$ gas.

During the film formation, the insulation film 58 having the second pattern operates as a mask so that the tungsten film is selectively formed solely on a portion of the doped semiconductor films 42a, 44a at which no insulation film 58 is present. Thus the source electrode 46 and the drain electrode 48 are formed on the doped portion of the semiconductor films 42, 44 disposed outside the channel protection film 40. When the tungsten film is formed, the doped semiconductor films 42a, 44a beneath the tungsten film is reduced and eroded.

The tungsten film is not formed on the doped semiconductor films 42a, 44a, provided they are covered by the insulation film 58 (40). Therefore, the semiconductor films 42a, 44a are left as the semiconductor contact portions 42, 44. The source electrode 46 and the drain electrode 48 are electrically connected to the operative semiconductor film 38 via the semiconductor contact portions 42, 44.

Figure 11:
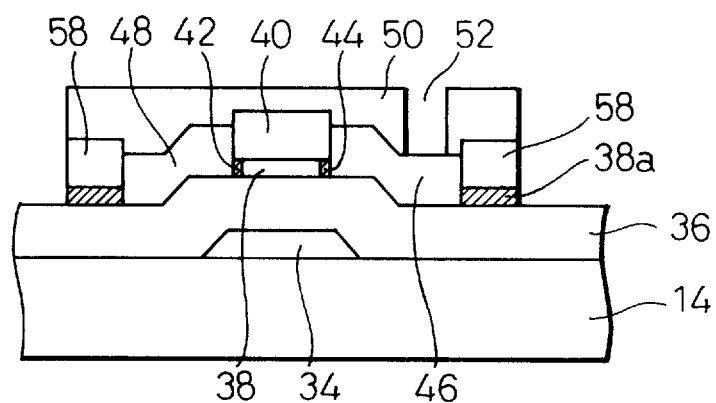
FIG. 11 is a cross-sectional view illustrating the next step of FIG. 10.

Next, as shown in FIG. 11, a SiN layer of 3000 Å is formed by a plasma CVD method to be the insulation film 50. The insulation film has a hole 52 for connecting the source electrode 46 to the picture electrode 24 and an opening at a position where the picture electrode 24 is to be located. This is done by a fourth photolithographic process including a resist applying step, an exposure step and an RIE etching step. During this process, not only part of the insulation film 50 but also part of the insulation film 58 and the doped semiconductor films 42a, 44a beneath the insulation film 50 are properly removed in conformity with the pixel configuration. $SF_6/O_2$ and $BCl_3/Cl_2$ are respectively used as an etching gas in this step.

Figure 12:
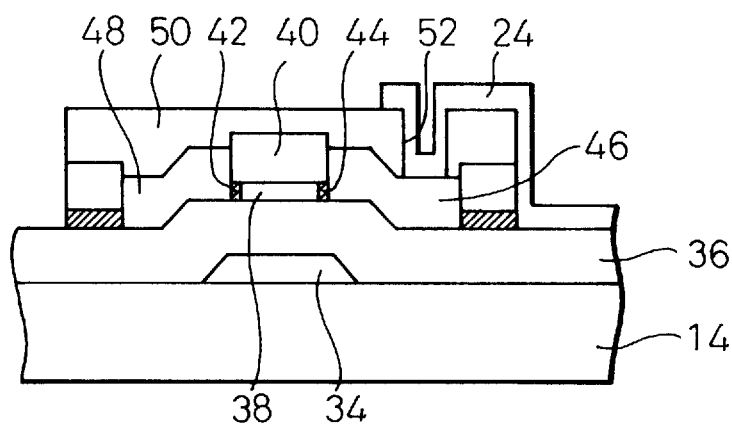
FIG. 12 is a cross-sectional view illustrating the next step of FIG. 11.

Then, as shown in FIG. 12, the pixel electrode 24 is formed from ITO of 1000 Å thick by a fifth photolithographic process including a resist-coating step, an exposure step and a wet etching step. In such a manner, the thin-film transistor 32 and the pixel electrode 24 can be prepared by the fifth photolithographic process. Thus, according to the inventive method, it is possible to minimize the stray capacitance caused by the overlapping of the source and drain electrodes with the gate electrode, without increasing the number of photolithographic processes compared with the conventional method, and thus resulting in a thin-film transistor having a good contact characteristic. Such a method for fabricating the thin-film transistor is suitable for the production of a TFT substrate for a liquid crystal display device.

FIGS. 14 to 19 illustrate another inventive method for the production of a thin-film transistor (TFT) 32.

Figure 14:
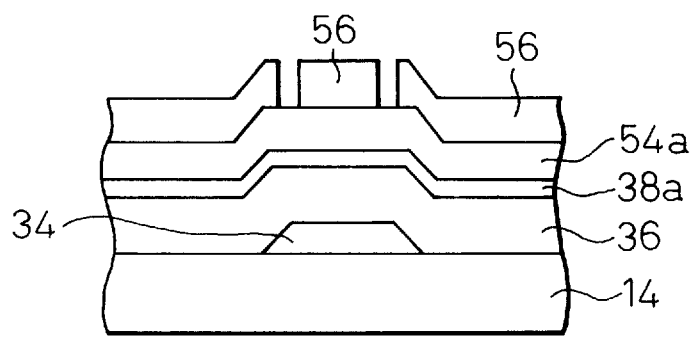
FIG. 14 is a cross-sectional view illustrating one step of a method for fabricating the thin-film transistor according to the second example.

FIG. 14 shows that, after forming a gate electrode 34 and a gate bus line 28 on a substrate 14 in the same manner as that shown in FIG. 4 of the preceding example, a gate insulation film 36, a layer 38a for constituting an operative semiconductor film 38 and a layer 54a for constituting an insulation film 54 having a first pattern are formed, and a resist 56 of a predetermined pattern is formed on the layer 54a.

In this example, the resist 56 is not subjected to the back side exposure, but is patterned so that openings are provided solely in areas to be doped with impurity for constituting semiconductor portions 42, 44.

Figure 15:
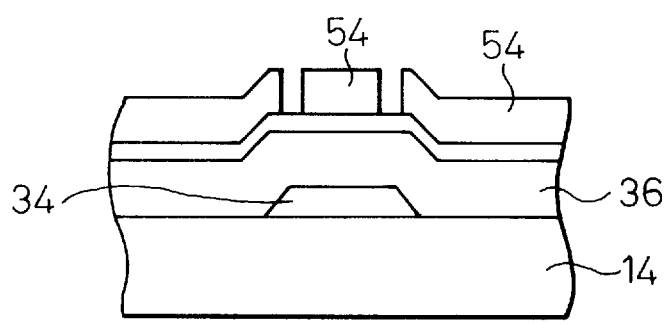
FIG. 15 is a cross-sectional view illustrating the next step of FIG. 14.

Then, as shown in FIG. 15, the layer 54a is etched while using the resist 56 as a mask form the insulation film 54 having the first pattern, and the resist 56 is removed.

Figure 16:
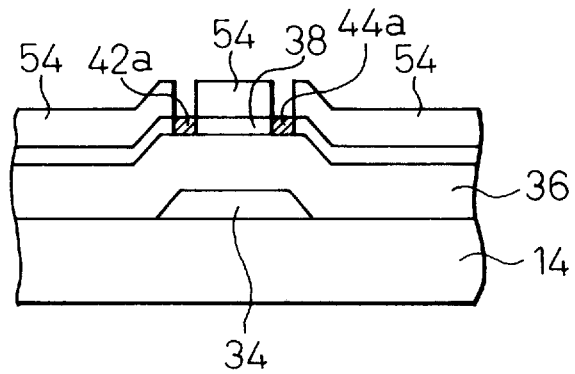
FIG. 16 is a cross-sectional view illustrating the next step of FIG. 15.
Figure 17:
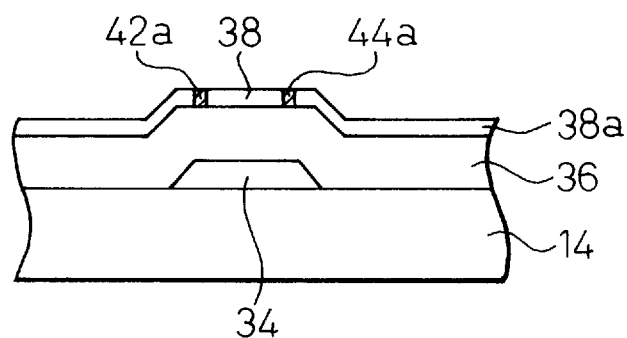
FIG. 17 is a cross-sectional view illustrating the next step of FIG. 16.

As shown in FIG. 16, impurity is injected into the layer 38a for constituting the operative semiconductor film 38 while using the insulation film 54 having first pattern as a mask. Then, portions of the layer 38a corresponding to the openings of the insulation film 54 become the doped semiconductor films 42a, 44a, while another portion of the layer 38a beneath the insulation film 54 is not doped and becomes the operative semiconductor film 38. As shown in FIG. 17, thereafter, the insulation film 54 is removed.

Figure 18:
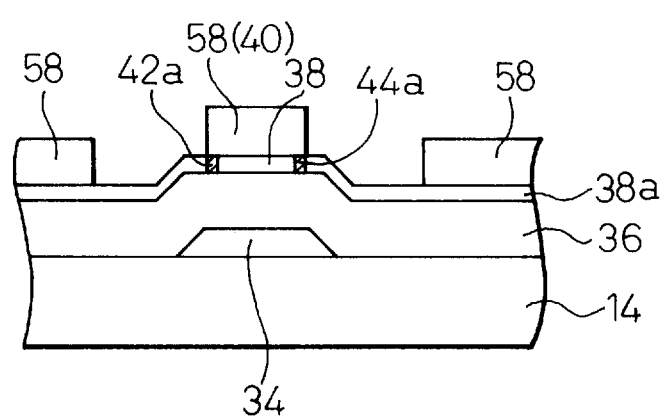
FIG. 18 is a cross-sectional view illustrating the next step of FIG. 17.

Then, as shown in FIG. 18, an insulation film 58 having the second pattern is formed on the layer 38a. The second patterned insulation film 58 is formed so that it covers an area for forming the non-doped operative semiconductor film 38 and at least part of areas for forming the doped semiconductor films 42a, 44a, and has an opening for exposing the layer 38a in an area for forming the source electrode and the drain electrode.

Figure 19:
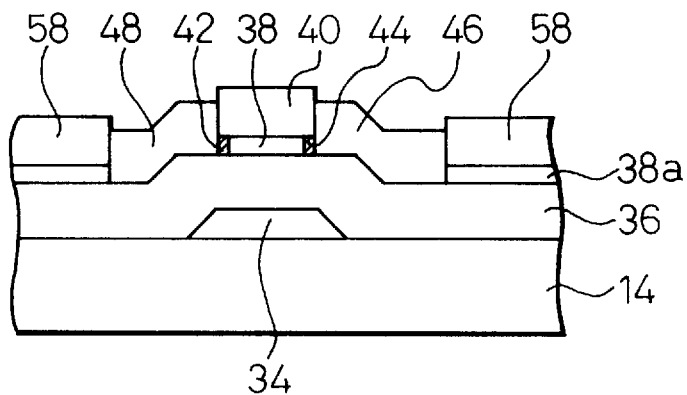
FIG. 19 is a cross-sectional view illustrating the next step of FIG. 18.

Next, as shown in FIG. 19, in the same manner as the preceding example, a tungsten film is selectively grown while using the insulation film 58 having the second pattern as a mask to form a source electrode 46 and a drain electrode 48. During the formation of the tungsten film, the doped semiconductor films 42a, 44a are reduced and eroded. The insulation film 58 having the second pattern provides a channel protection film 40 covering the operative semiconductor film 38. The channel protection film 40 also covers the doped semiconductor films 42a, 44a.

A portion of the insulation film 58 covering an area for constituting the operative semiconductor film 38 and at least part of an area for constituting the doped semiconductor films 42a, 44a are sized so that ends of the insulation film 58 substantially coincide with ends of the doped semiconductor films 42a, 44a (corresponding to those of the source electrode and the drain electrode). In this regard, part of end portions of the doped semiconductor films 42a, 44a may not be completely covered with the insulation film 58 (40) but exposed. In such a case, the tungsten film grows into both the doped and non-doped areas to form the source electrode 46 and the drain electrode 48.

FIGS. 20 to 25 illustrate a further inventive method for the production of a thin-film transistor (TFT) 32.

Figure 20:
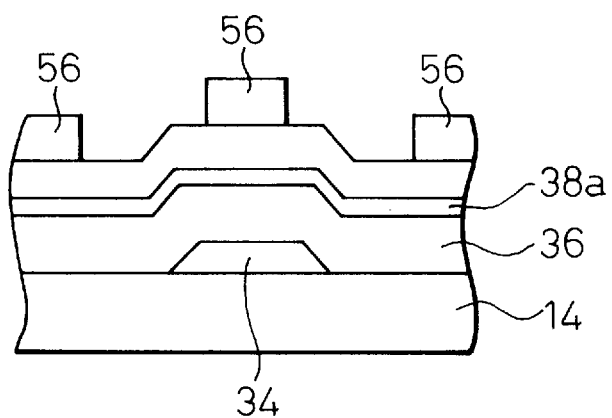
FIG. 20 is a cross-sectional view illustrating one step of a method for fabricating the thin-film transistor according to the third example.

FIG. 20 shows that, after forming a gate electrode 34 and a gate bus line 28 on a substrate 14 in the same manner as that shown in FIG. 4 of the preceding example, a gate insulation film 36, a layer 38a for constituting an operative semiconductor film 38 later and a layer 54a for constituting an insulation film 54 having a first pattern are formed, and a resist 56 of a predetermined pattern is formed on the layer 54a.

In this example, a resist 56 is patterned to have openings in ares wherein doped semiconductor contact portions 42, 44 and source and drain electrodes 46, 48 are formed.

Figure 21:
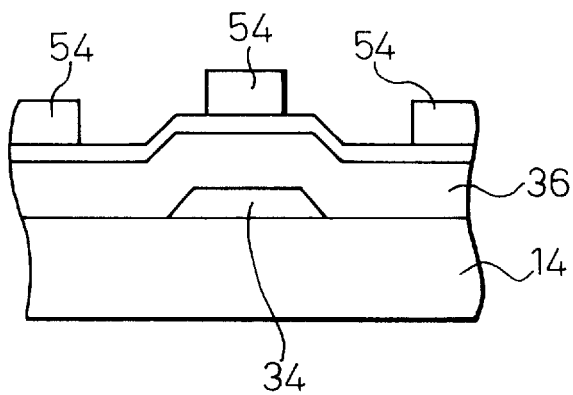
FIG. 21 is a cross-sectional view illustrating the next step of FIG. 20.

As shown in FIG. 21, a layer 54a is etched while using the resist 56 as a mask to form an insulating film 54 having a first pattern, and then the resist 56 is removed.

Figure 22:
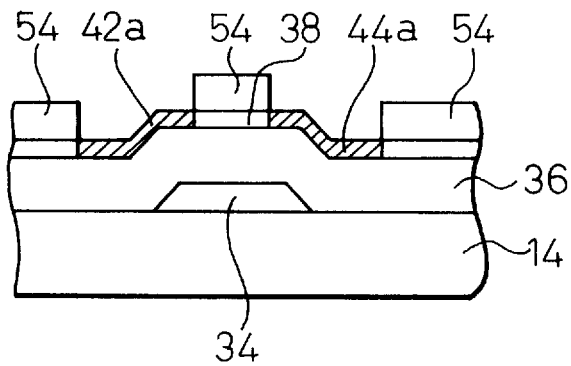
FIG. 22 is a cross-sectional view illustrating the next step of FIG. 21.
Figure 23:
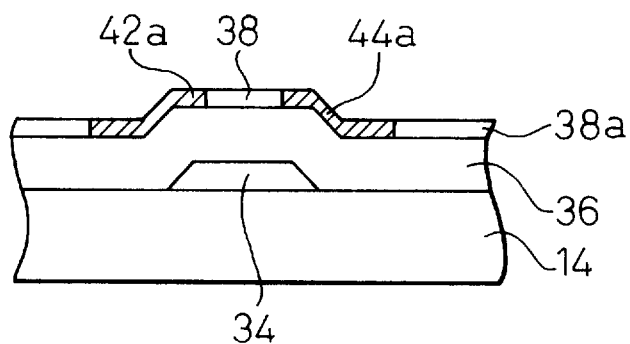
FIG. 23 is a cross-sectional view illustrating the next step of FIG. 22.

Next, as shown in FIG. 22, impurity is injected into a layer 38a while using the first patterned insulation film 54, whereby an area for constituting a non-doped operative semiconductor film 38 and areas for constituting doped semiconductor films 42a, 44a. As shown in FIG. 23, the insulation film 54 is removed.

Figure 24:
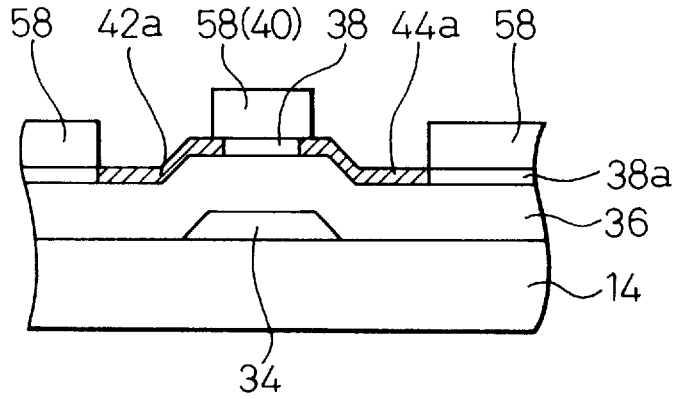
FIG. 24 is a cross-sectional view illustrating the next step of FIG. 23.

Then, as shown in FIG. 24, an insulation film 58 having a second pattern is formed on the layer 38a. The insulation film 58 having the second pattern covers the area for constituting the non-doped operative semiconductor film 38 and at least part of the areas for constituting the doped semiconductor films 42a, 44a, and has openings in areas for forming source and drain electrodes to expose the layer 38a.

Figure 25:
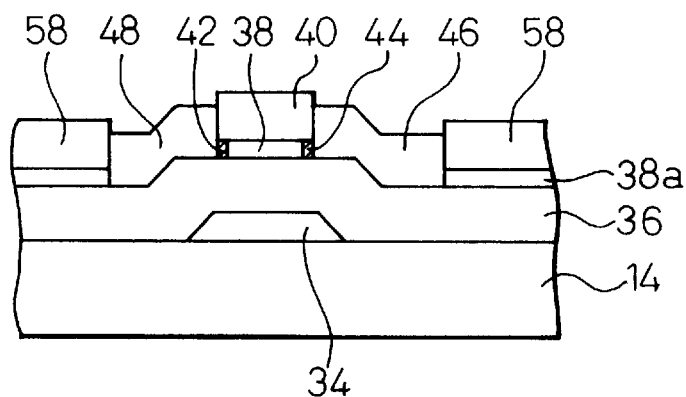
FIG. 25 is a cross-sectional view illustrating the next step of FIG. 24.

Thereafter, as shown in FIG. 25, a tungsten film is selectively grown while using the insulation film 58 having the second pattern as a mask to form the source electrode 46 and the drain electrode 48. During the formation of the tungsten film, the doped semiconductor films 42a, 44a beneath the tungsten film are reduced and eroded. The insulation film 58 having the second pattern provides a channel protection film 40 covering the operative semiconductor film 38, which also covers the doped semiconductor films 42a, 44a.

A portion of the insulation film 58 covering an area for constituting the operative semiconductor film 38 and at least part of an area for constituting the doped semiconductor films 42a, 44a are sized in accordance with a size of the semiconductor contact portions 42, 44 to be formed. Ends of the insulation film 58 defining the outside surfaces of the source electrode 46 and the drain electrode 48 substantially coincide with ends of the doped semiconductor films 42a, 44a in FIG. 24. However, such a coincidence is not always necessary but the insulation film 58 may either completely cover the doped semiconductor films 42a, 44a or allow the non-doped layer to be exposed in the opening of the insulation film 58. Since the selectively growing tungsten film can extend, in either cases, onto both the doped semiconductor films 42a, 44a and the non-doped semiconductor film, the source electrode 46 and the drain electrode 48 are formed in the opening of the insulation film 58.

FIGS. 26 to 32 illustrate a further example of the inventive method for the production of a thin-film transistor (TFT) 32. In this example, the source electrode 46 and the drain electrode 48 are formed from a tungsten film prepared by a method other than the selective growth.

Figure 26:
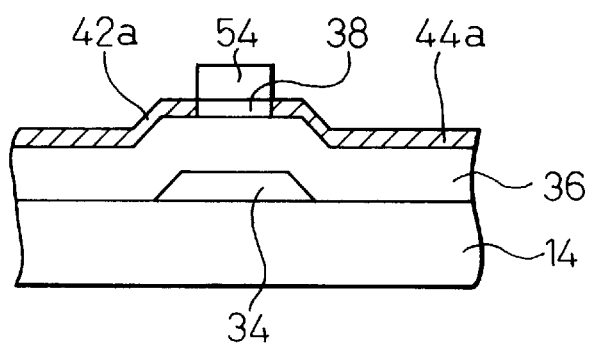
FIG. 26 is a cross-sectional view illustrating one step of a method for fabricating the thin-film transistor according to the fourth example.

FIG. 26 shows that, after forming a gate electrode 34 and a gate bus line 28 on a substrate 14, a gate insulation film 36, a layer 38a for constituting an operative semiconductor film 38 later and an insulation film 54 having a first pattern are formed, and impurity is injected into the layer 38a while using the insulation film 54 as a mask in the same manner as shown in FIGS. 4 to 7 of the preceding example. The insulation film 54 can be patterned by the back side exposure, or the masking method.

Figure 27:
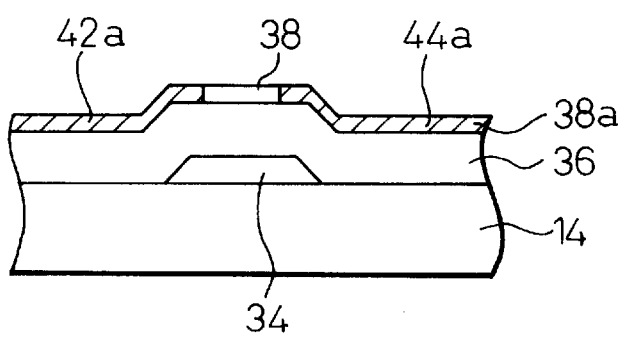
FIG. 27 is a cross-sectional view illustrating the next step of FIG. 26.

Thus, an area for constituting the non-doped operative semiconductor film 38 and an area for constituting the doped semiconductor films 42a, 44a are prepared. As shown in FIG. 27, the insulation film 54 is removed.

Figure 28:
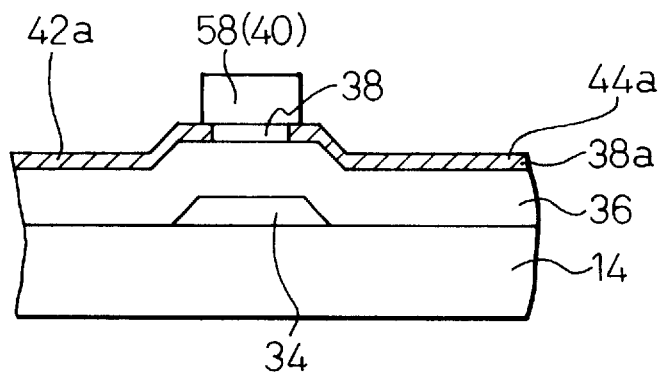
FIG. 28 is a cross-sectional view illustrating the next step of FIG. 27.

Then, as shown in FIG. 28, an insulation film 58 having a second pattern for covering the area for constituting the non-doped operative semiconductor film 38 and at least the area for constituting the doped semiconductor films 42a, 44a are formed. The insulation film 58 can be formed by the back side exposure while using a gate electrode 34 or the exposure while using a mask.

Figure 29:
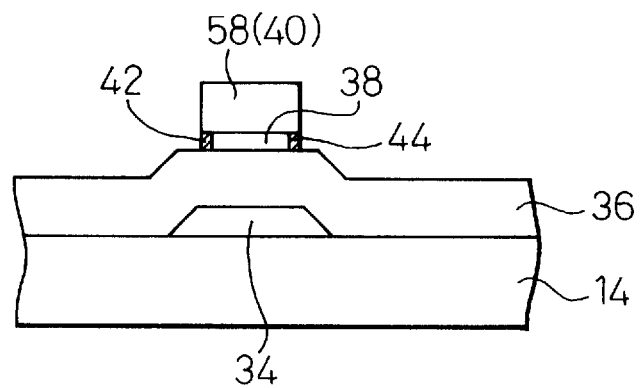
FIG. 29 is a cross-sectional view illustrating the next step of FIG. 28.

Thereafter, as shown in FIG. 29, portions of the doped semiconductor films 42a, 44a not covered with the insulation film 58 are removed while using the insulation film 58 as a mask. In this regard, a portion of the doped semiconductor films 42a, 44a covered with the insulation film 58 is left as it is together with the area for constituting the non-doped operative semiconductor film 38.

Figure 30:
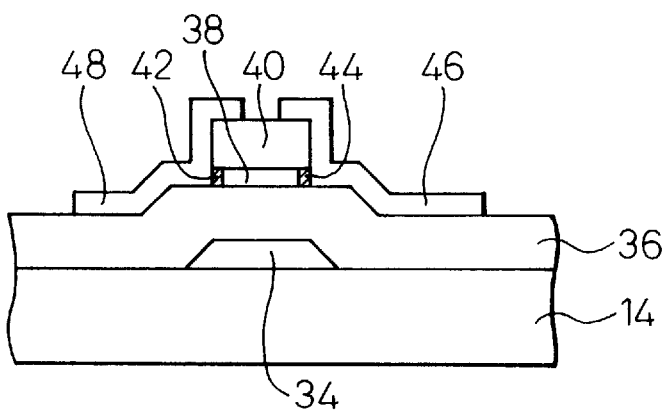
FIG. 30 is a cross-sectional view illustrating the next step of FIG. 29.
Figure 31:
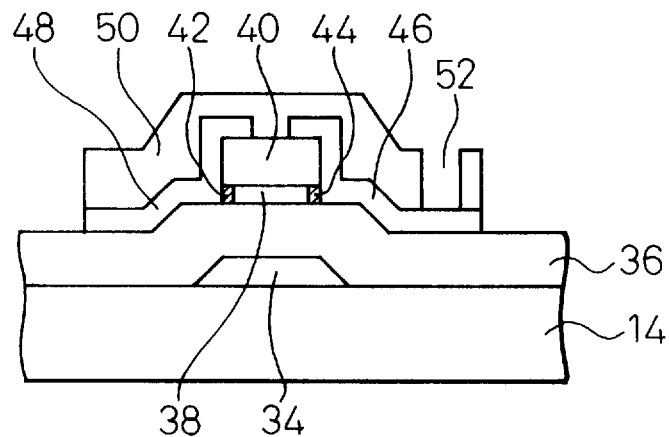
FIG. 31 is a cross-sectional view illustrating the next step of FIG. 30.
Figure 32:
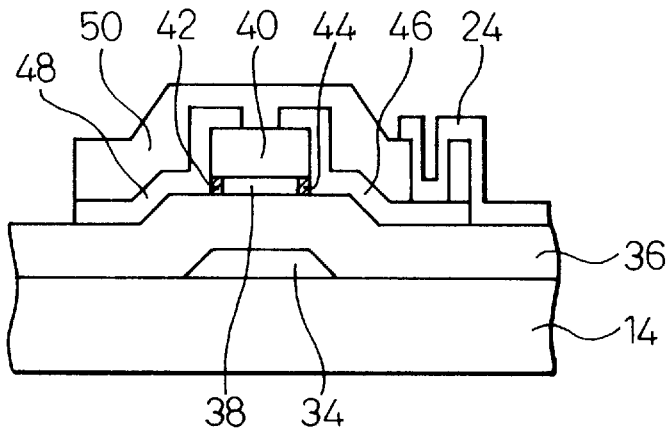
FIG. 32 is a cross-sectional view illustrating the next step of FIG. 31.

Next, as shown in FIG. 30, a metallic layer of titanium, chromium or others is formed by a sputtering method, and patterned to form a source electrode 46 and a drain electrode 48. Thereafter, as shown in FIG. 31, an insulating film 50 is formed, wherein a hole 52 for the connection of a pixel electrode 24 with the source electrode 46 is provided. Then, as shown in FIG. 32, ITO is formed and patterned to provide the pixel electrode 24.

As described above, according to the present invention, it is possible to minimize the stray capacitance created due to the overlapping of the gate electrode with the source and drain electrodes, and thus provide a thin-film transistor excellent in the contact characteristic and a method for the production thereof as well as a liquid crystal display.

What we claim is:

1. A method for producing a thin-film transistor, comprising the steps of:
    forming a gate electrode on a substrate;
    forming a gate insulation film on the gate electrode;
    forming a layer, on the gate insulation film, which is used to form an operative semiconductor film;
    forming an insulation film having a first predetermined pattern on the layer;
    doping the layer not covered by the insulation film having the first pattern with impurity to form semiconductor films doped with impurity, the portion of the layer covered by the insulation film having the first pattern not doped with impurity forms the operative semiconductor film;
    removing the insulation film having the first pattern and forming another insulation film having a second pattern larger than the first pattern forming a channel protection film covering the operative semiconductor film and at least part of the doped semiconductor films, the part of the doped semiconductor films covered by the channel protection film form semiconductor contact portions; and
    forming a source electrode and a drain electrode connected to the semiconductor contact portions.

2. A method for producing a thin-film transistor defined by claim 1, wherein the step for doping the third layer while using the insulation film having the first pattern as a mask is carried out by ion-doping to a semiconductor film made of a-Si to form n$^+$a-Si.

3. A method for producing a thin-film transistor defined by claim 1, wherein the insulation film having the first pattern is patterned by a back side exposure while using the gate electrode as a mask.

4. A method for producing a thin-film transistor defined by claim 3, wherein an amount of offset of the semiconductor contact portions covered by the channel protection film, measured from the ends of the channel protection film, is controlled by a side etching when the insulation film having the first pattern is formed.

5. A method for producing a thin-film transistor defined by claim 4, wherein the amount of offset is 2 μm or less.

6. A method for producing a thin-film transistor defined by claim 1, wherein the step of forming the source electrode and drain electrode include forming a metallic film on portions of the doped semiconductor films disposed outside the channel protection film by a selective growth of the metallic film solely in a area not covered by the channel protection film.

7. A method for producing a thin-film transistor defined by claim 6, wherein the selective growth is carried out by a thermal CVD method.

* * * * *